(12) United States Patent
Ishii

(10) Patent No.: US 6,442,744 B1
(45) Date of Patent: Aug. 27, 2002

(54) METHOD AND APPARATUS FOR IMPROVING AUTO-PLACEMENT IN SEMICONDUCTOR INTEGRATED CIRCUIT DESIGN

(75) Inventor: Hideaki Ishii, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/457,734

(22) Filed: Dec. 10, 1999

(30) Foreign Application Priority Data

Dec. 25, 1998 (JP) .......................................... 10-371104

(51) Int. Cl.[7] .............................................. G06F 17/50
(52) U.S. Cl. .............................................. 716/13; 716/5
(58) Field of Search ............................... 716/2, 3, 5–6, 716/9, 12, 13, 18, 1, 4, 10–11, 14–15, 16–17; 703/401

(56) References Cited

U.S. PATENT DOCUMENTS

| | | | | |
|---|---|---|---|---|
| 3,653,072 A | * | 3/1972 | Ballas et al. ............... | 716/12 |
| 5,311,442 A | * | 5/1994 | Fukushima ................. | 716/9 |
| 5,490,268 A | * | 2/1996 | Matsunaga ................. | 703/401 |
| 5,590,049 A | * | 12/1996 | Arora ........................ | 716/5 |
| 5,654,898 A | * | 8/1997 | Roetcisoender et al. ... | 716/18 |
| 5,724,250 A | * | 3/1998 | Kerzman et al. .......... | 716/2 |
| 5,726,903 A | * | 3/1998 | Kerzman et al. .......... | 716/3 |
| 6,247,167 B1 | * | 6/2001 | Raspopovic et al. ....... | 716/13 |
| 6,260,177 B1 | * | 7/2001 | Lee et al. .................. | 716/2 |

* cited by examiner

Primary Examiner—Matthew Smith
Assistant Examiner—Paul Dinh
(74) Attorney, Agent, or Firm—Arent Fox Kintner Plotkin & Kahn

(57) ABSTRACT

After auto-placement, nets are classified into groups each having logically equivalent signals, terminal placement range of each net is determined, and overlap regions of respective pairs of the ranges in the same group is obtained. In each net of each pair having this overlap region, such an input terminal in the overlap region is found out that an wiring length between an output terminal and the input terminal is maximum (S30 and S31), and a decrement $\Delta$ in wiring length is calculated assuming that the two input terminals found out are exchanged (S32). If $\Delta>0$ (S33), then the two input terminals are exchanged with each other (S34). Such processing is repeated until $\Delta \leq 0$.

11 Claims, 16 Drawing Sheets

METHOD AND APPARATUS FOR IMPROVING AUTO-PLACEMENT IN SEMICONDUCTOR INTEGRATED CIRCUIT DESIGN

BACKGROUND OF THE INVENTION

1. Field of the Invention

The present invention relates to a method and apparatus for improving auto-placement of circuit elements such as cells and transistors in semiconductor integrated circuit design, a storage medium having a program for executing the method and a fabrication method of a semiconductor device using the method.

2. Description of the Related Art

In a design stage of a semiconductor integrated circuit, circuit elements thereof are automatically placed on a chip design plan by a computer on the basis of a net list. For example, in auto-placement according to a min-cut method, placement of elements is determined in the following way: a chip design plan is divided into two regions by a cut line to distribute the circuit elements into two groups on both sides of the cut line so that the number of interconnecting lines traversing the cut line is minimized, the two regions are each further divided by a cut line under the same condition and such a process is repeated until one element is included in a divided region. In another prior art auto-placement, not only the number of interconnecting lines traversing the cut line, but also areas of elements stored in a cell library, are taken into consideration, and the sums of areas of elements in the respective two regions divided as above are calculated to obtain a difference between the sums, and the elements are placed as above so that the difference does not exceed a set value.

However, as the scale of a semiconductor integrated circuit has been larger, wiring congestion has been increased, which in turn, has caused a longer wiring length. Since a ratio of a wiring delay due to wiring resistance and capacitance to a gate delay is increased by miniaturization of circuit elements, there is a demand on reduction in wiring length by decreasing a degree of wiring congestion.

SUMMARY OF THE INVENTION

Accordingly, it is an object of the present invention to provide a method and apparatus for improving auto-placement to enable wiring length to be shortened, a storage medium having a program for executing the method and a fabrication method of a semiconductor device using the method.

In the present invention, there is provided a method of improving an auto-placement by a computer, the auto-placement being performed by placing circuit elements on a design plan based on a net list, comprising the steps of: (1) classifying nets into such groups after the auto-placement that nets of each group have logically equivalent signal; and (2) exchanging input terminals between different nets in a group so as to shorten a wiring length.

With the present invention, a wiring length is shortened and wiring congestion is decreased as a result.

Other aspects, objects, and the advantages of the present invention will become apparent from the following detailed description taken in connection with the accompanying drawings.

DESCRIPTION OF THE PREFERRED EMBODIMENTS

Figure 1:
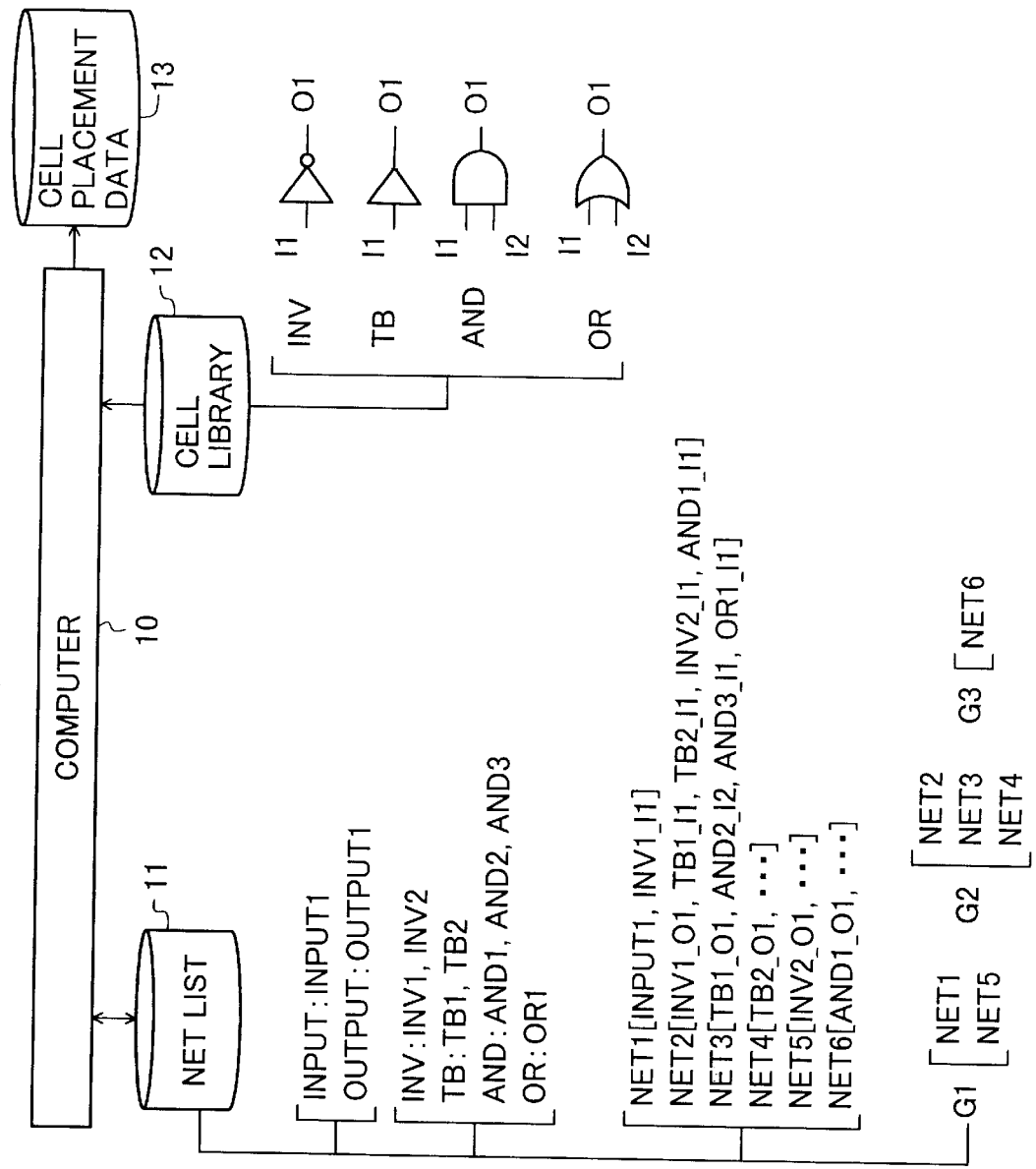
FIG. 1 is a schematic diagram showing an apparatus for achy improving auto-placement of an embodiment according to the present invention.

Referring now to the drawings, wherein like reference characters designate like or corresponding parts throughout several views, preferred embodiments of the present invention are described below.

First Embodiment

FIG. 1 shows a schematic configuration of an apparatus for improving auto-placement.

A computer 10 places cells on a chip design plan according to the above described prior art method on the basis of only a net list stored in a net list storage section 11 or together with cell information stored in a cell library storage section 12, and stores the placement result in a cell placement data storage section 13. Since the storage sections 11 to 13 are described in a functionally separated manner for clarity of description, those may be stored into one storage device.

Figure 2:
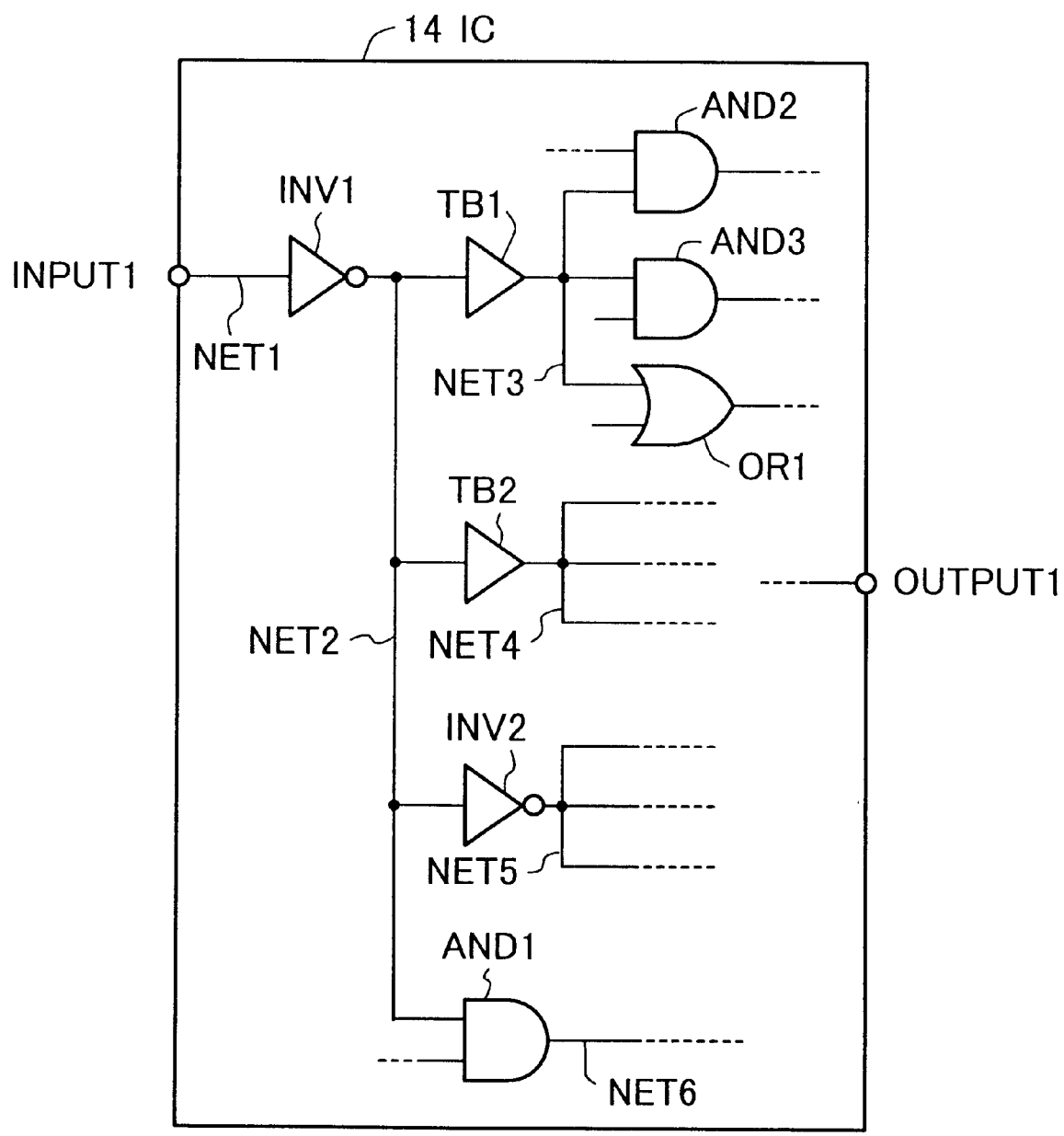
FIG. 2 is a logic circuit diagram illustrating equivalent net.

For example as shown in FIG. 2, when logic design of a semiconductor integrated circuit 14 has performed, a net list including NET 1 to NET 6 is also prepared. Inverters INV1 and INV2 in FIG. 2 are instances of a inverter INV in the cell library 12 in FIG. 1, and characteristics, a cell area, input and output terminal positions and name of the inverter INV are stored in the cell library 12 as cell information on an inverter INV. In FIG. 2, true buffer gates TB1 and TB2, AND gates AND1 to AND3, and an OR gate OR1 each are also same as described above. Correspondences between cells in the cell library 12 and their instances in FIG. 2 are written in the net list as shown in FIG. 1. With the correspondences, by referring to the cell library 12, it is possible to know the characteristics, cell area, input and output terminal positions and name of the cells in the circuit 14.

NET1 is an interconnection between an input terminal INPUT1 of the chip and the input terminal I1 of the inverter INV1, is denoted as NET1[INPUT1, INV1_I1] as shown in FIG. 1, and stored in the net list storage section 11.

In FIG. 1, INPUT: INPUT1 and OUTPUT: OUTPUT1 indicate that INPUT1 and OUTPUT1 in the net list are an input terminal and an output terminal of the chip, respectively.

Likewise, NET2 and NET3 are expressed as follows:

NET2[INV1_O1, TB1_I1, TB2_I1, INV2_I1, AND1_I1]

NET3[TB1_O1, AND2_I2, AND3_I1, OR1_I1].

Auto-placement of cells are performed according to, for example, the above described prior art mini-cut method on the basis of data in the net list storage section 11 and the cell library storage section 12, and the placement result is stored in the cell placement data storage section 13.

Figure 5:
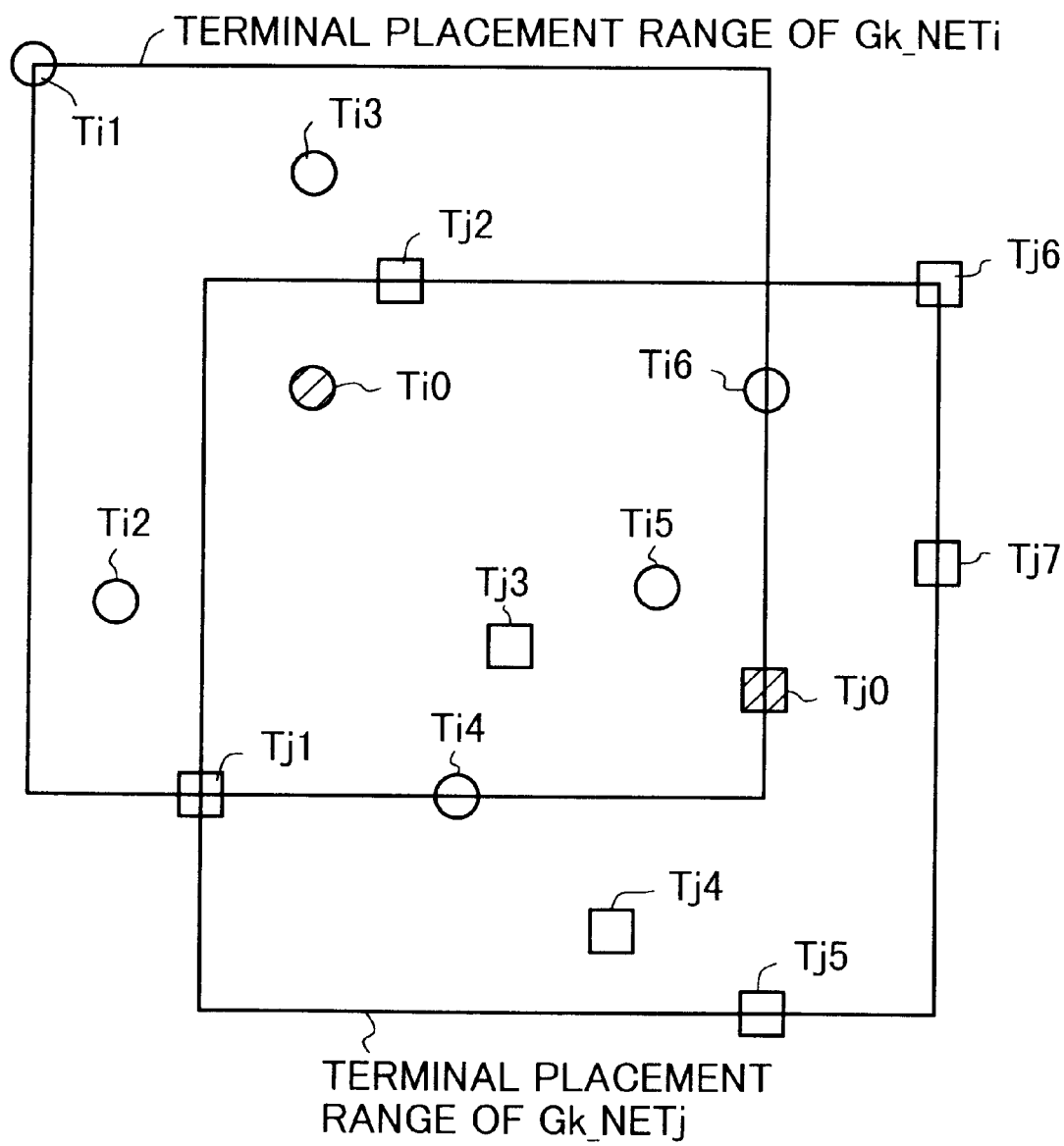
FIG. 5 is a diagram showing terminal placements and the ranges thereof before auto-placement improving process.

FIG. 2 shows a relation of logic connection and a degree of wiring congestion cannot be known from this figure. Assume that, as a result of the auto-placement, terminals of the chip and cells are placed as shown in FIG. 5. In FIG. 5, Ti0 to Ti6 are terminals of NETi, and Tj0 to Tj7 are terminals of NETj. Ti0 and Tj0 having hatch lines are output terminals of chip or cell and the other terminals are input terminals of chip or cell. The terminals have no relation with the circuit of FIG. 2.

Figure 6:
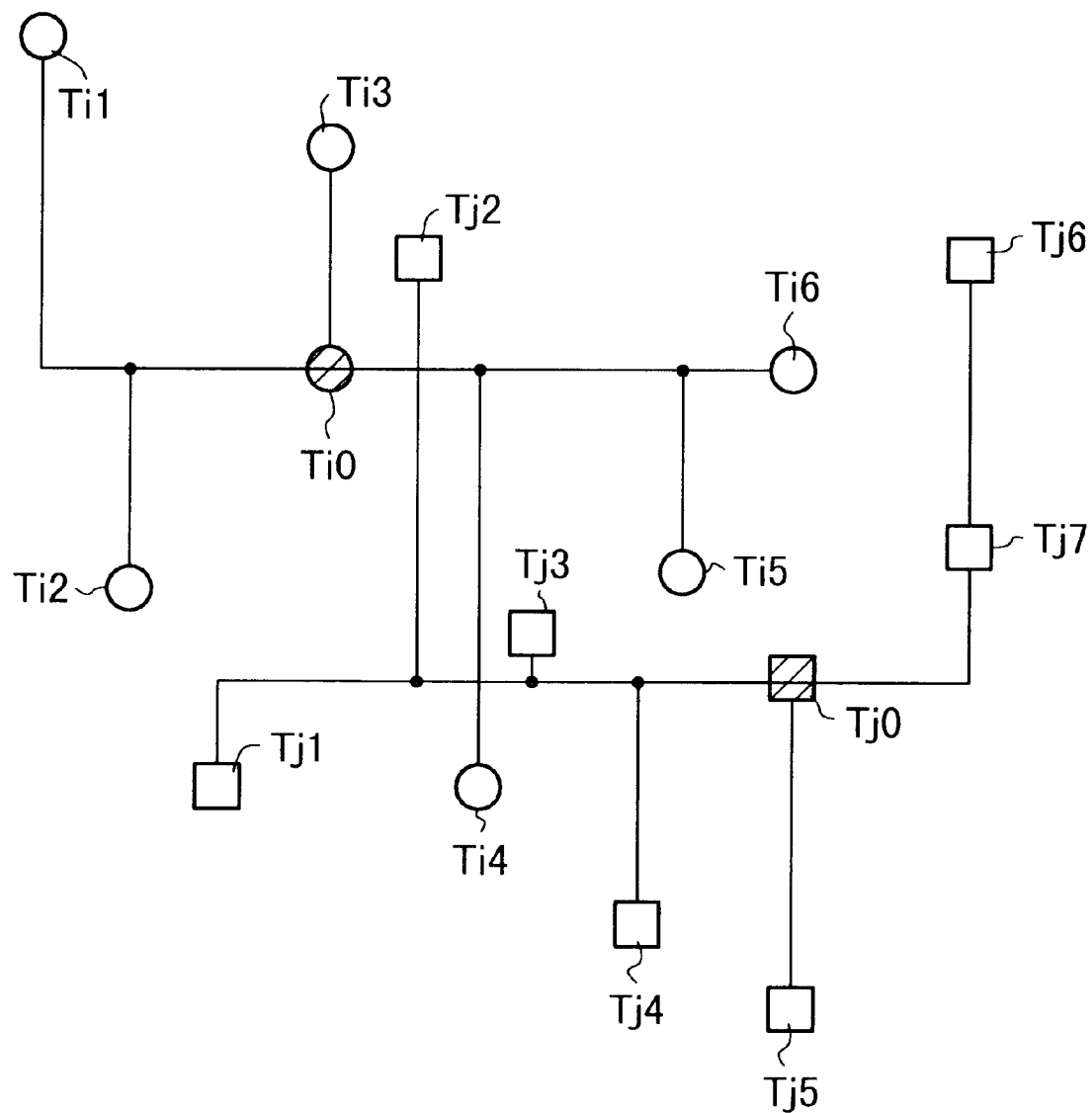
FIG. 6 is a diagram showing wiring in Steiner tree construction applied to the terminal placements of FIG. 5.

In FIG. 5, the smallest rectangle in which all the terminals of NETi are included is defined as a terminal placement range of NETi. This applies to NETj as well. When the terminal placement ranges of NETi and NETj are overlapped as shown in FIG. 5, wiring congestion occurs. FIG. 6 shows wiring in Steiner tree constructions (in which a line passing through an output terminal is perpendicular to lines each end of which is an input terminal), which connect terminals in NETi and NETj, respectively, in FIG. 5. From FIG. 6, it is clear that NETi and NETj are crossed and wiring congestion exists.

Now in FIG. 2, NET1 and NET5 are logically equivalent to each other, and NET2 to NET4 are also logically equivalent to one another. In FIG. 5, if NETi and NETj are logically equivalent, any input terminal of NETi can be exchanged with any input terminal of NETj.

The exchange should be limited to one that efficiently decreases a degree of wiring congestion in order to shorten a processing time. Therefore, inputs in the overlap area between the terminal placement ranges of NETi and NETj are allowed to exchange. With this, wiring length (Manhattan length, this applies hereinafter) will be shortened compared with one before the exchange.

Next, description will be made of a method of improving auto-placement according to a computer program.

Figure 3:
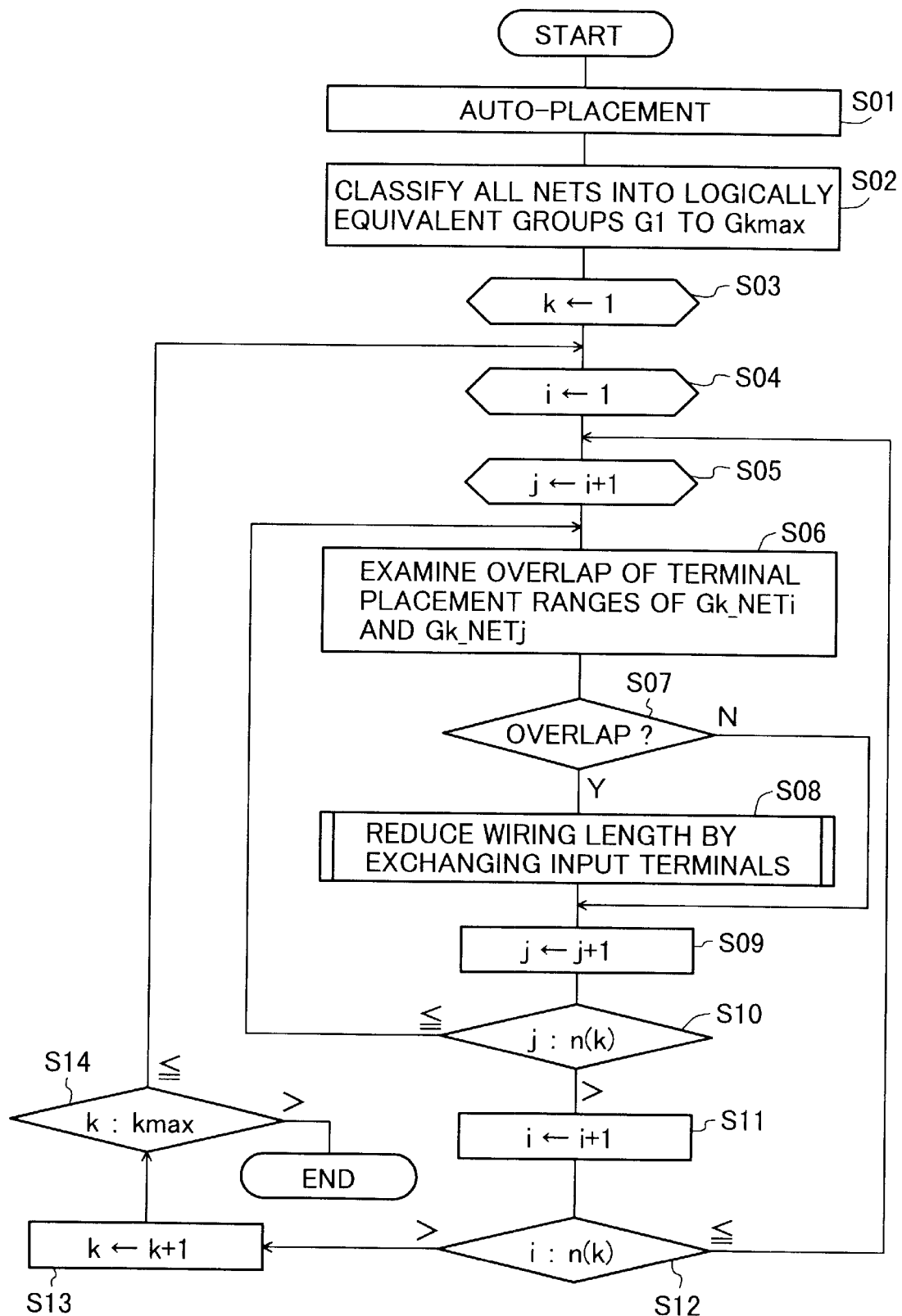
FIG. 3 is a general flow chart showing an improving process of cell auto-placement of the embodiment according to the present invention.

FIG. 3 is a general flow chart of cell auto-placement and its improvement. Below, contents in parenthesis indicate a step identification number.

(S01) Auto-placement as described above is performed.

The following improving process is performed on a result of the auto-placement.

(S02) All nets are classified into logically equivalent groups G1 to Gkmax on the basis of a net list and input/output logics (functions) of cells. The input/output logic of each cell is written in the cell library. For example, a true buffer cell has a cell function name [TRUE], which tells its input/output logic.

For example, the nets of FIG. 2 are, as shown in FIG. 1, classified into three groups as follows:

Group G1 (NET1 and NET5)

Group G2 (NET2, NET3 and NET4)

Group G3 (NET6).

Below, for convenience of description, NETi that belongs to an equivalent net group Gk is denoted as Gk_NETi and for simplicity, it is assumed that Gk1_NETi is different from Gk2_NETi if k1≠k2.

(S03) An initial value 1 is substituted into an equivalent-net-group identification variable k.

(S04) An initial value 1 is substituted into an intra-group net identification variable i.

(S05) An initial value (i+1) is substituted into another intra-group net identification variable j.

(S06) It is examined whether or not the terminal placement ranges of Gk_NETi and Gk_NETj are overlapped each other.

(S07) If overlapped, then the process goes to step S08, or else the process goes to step S09.

(S08) In an overlap region, a wiring length will be reduced by exchanging input terminals between Gk_NETi and Gk_NETj, as described later, resulting in that wiring congestion will be reduced in degree.

(S09) The variable j is incremented by 1.

(S10) Denoting the number of nets in the equivalent net group Gk as n(k), if j≦n(k), then the process returns to step S06, or else the process goes to step S11.

(S11) The variable i is incremented by 1.

(S12) If i≦n(k), then the process returns to step S05, or else the process goes to step S13.

(S13) The variable k is incremented by 1.

(S14) If k≦kmax, then the process returns to step S04, or else the auto-placement improving process is terminated.

Figure 4:
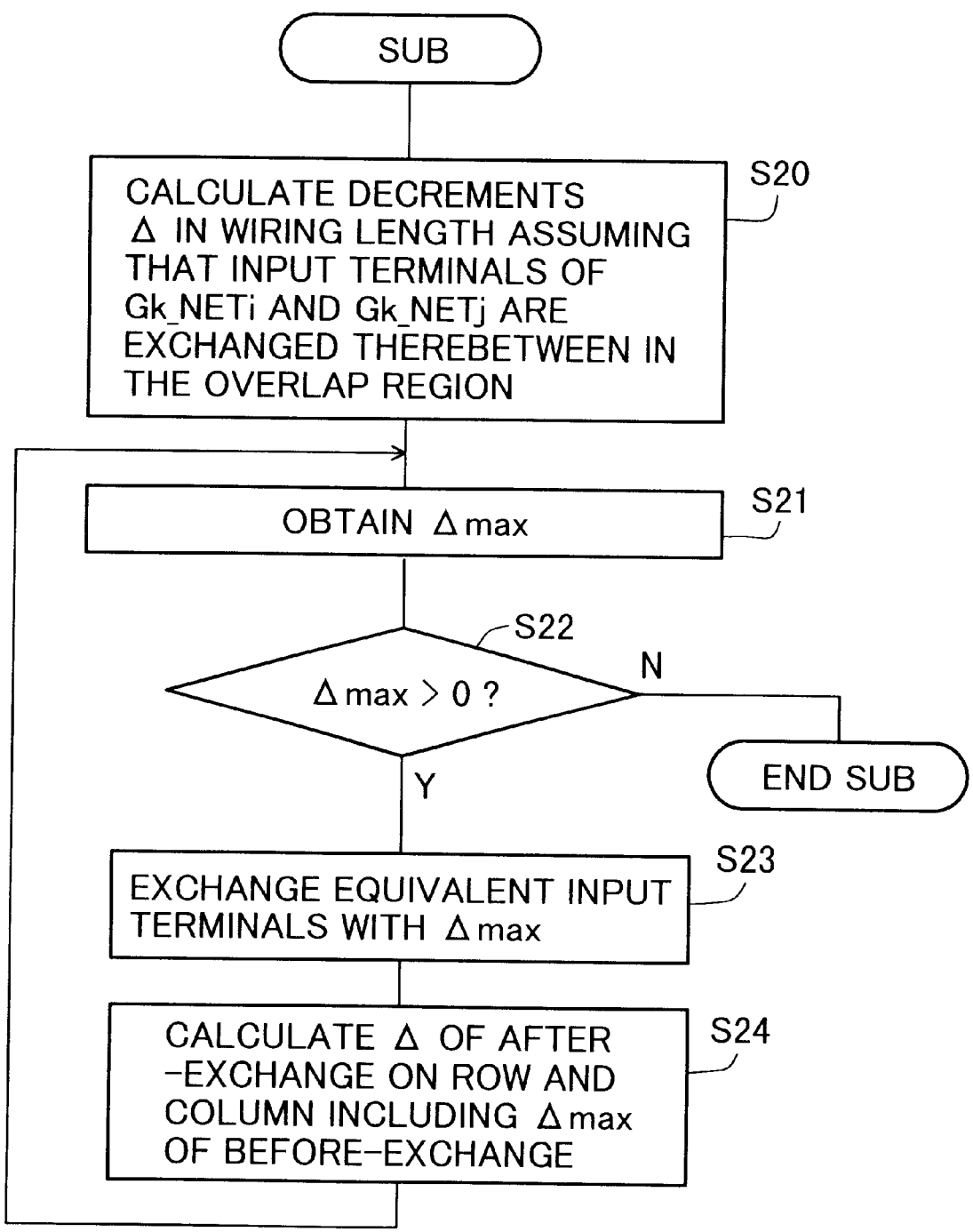
FIG. 4 is a detailed flow chart of step S08 in FIG. 3.

FIG. 4 is a detailed flow chart of step S08 in FIG. 3.

Figure 7A:
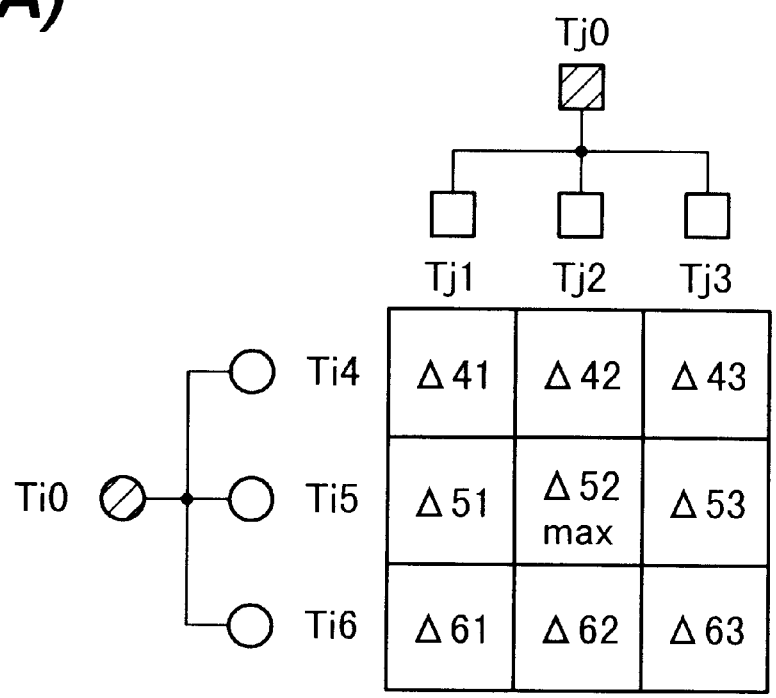
FIGS. 7(A) and 7(B) are illustrations for all combinations of input terminal exchange candidates in an overlap region and decrements Δ in wiring length by the exchange.

(S20) Decrements Δ in wiring length are calculated assuming that input terminals of Gk_NETi and Gk_NETj are exchanged therebetween in the overlap region of terminal placement ranges thereof. For example, in FIG. 5, decrements Δ in wiring length are calculated about all combinations of input terminals as shown in FIG. 7(A) when input terminals of Gk_NETi and input terminals of Gk_NETj are exchanged therebetween with respect to interconnections of an output terminal Ti0 of Gk_NETi with input terminals Ti4 to Ti6 of Gk_NETi in an overlap region and interconnections of an output terminal Tj0 of Gk_NETj with input terminals Tj1 to Ti3 of Gk_NETj in the overlap region.

Figure 8:
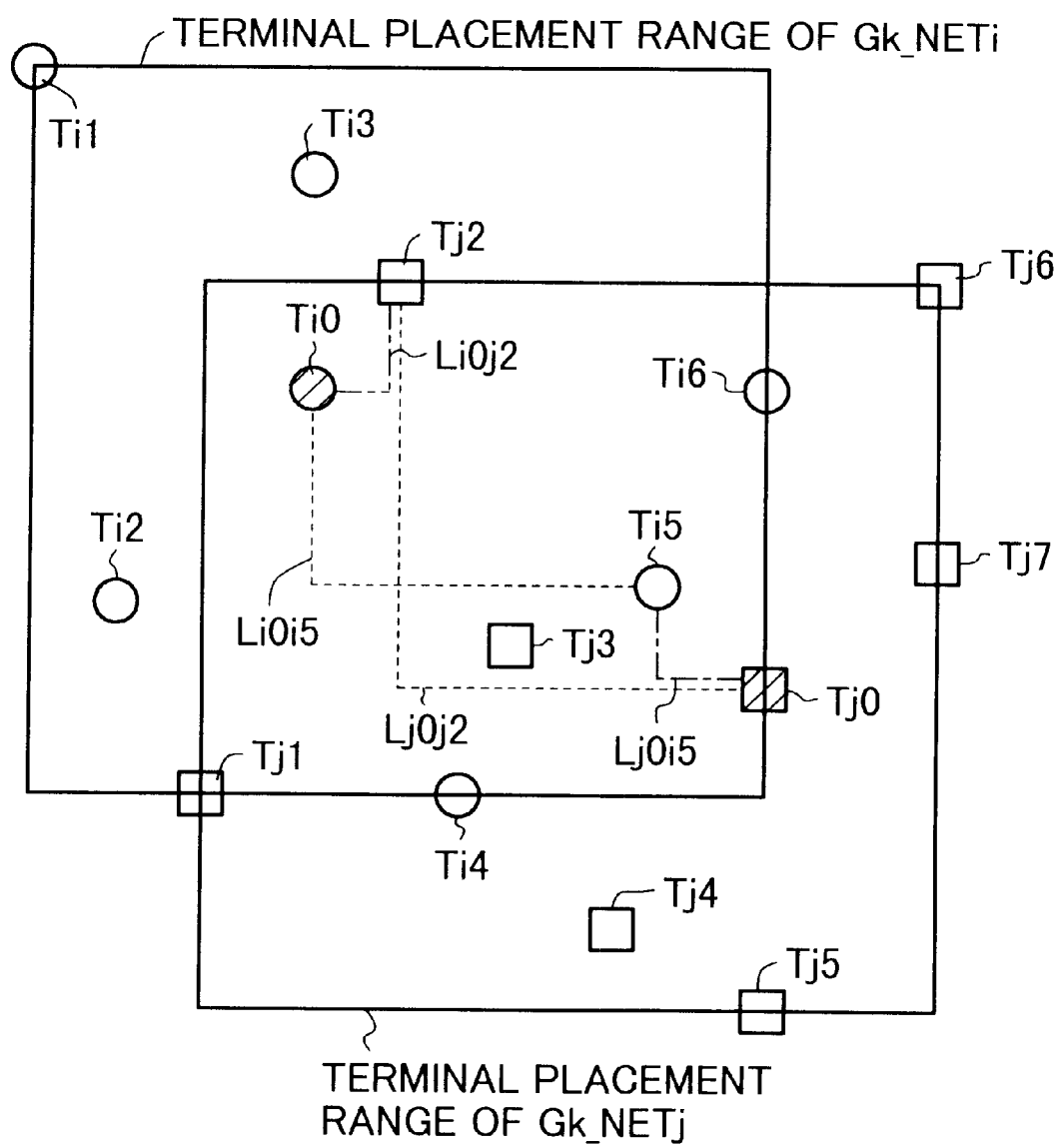
FIG. 8 is a diagram showing interconnections before and after the exchange of an input terminal Ti5 with an input terminal Tj2, taking place for a first time, respectively in dotted lines and dot-dash line.

For example, using the characters in FIG. 8, a decrement Δ 52 in wiring length is expressed by the following formula:

$$\Delta 52 = (LiOi5 + Ljoj2) - (LiOj2 + LjOi5),$$

where LiOi5 is a Manhattan length of an interconnection between the output terminal Ti0 and the input terminal Ti5, and the other wiring lengths are expressed in the same way. In FIG. 8, interconnections before and after the exchange of input terminals are shown by dotted lines and dot-dash lines, respectively.

(S21) The maximum value Δmax is obtained from decrements Δ in wiring length resulted from calculation in step S20. In FIG. 7(A), Δmax=Δ52.

(S22) If Δmax>0, then the process goes to step S23, or else the process in step S08 in FIG. 3 is terminated.

Figure 7B:
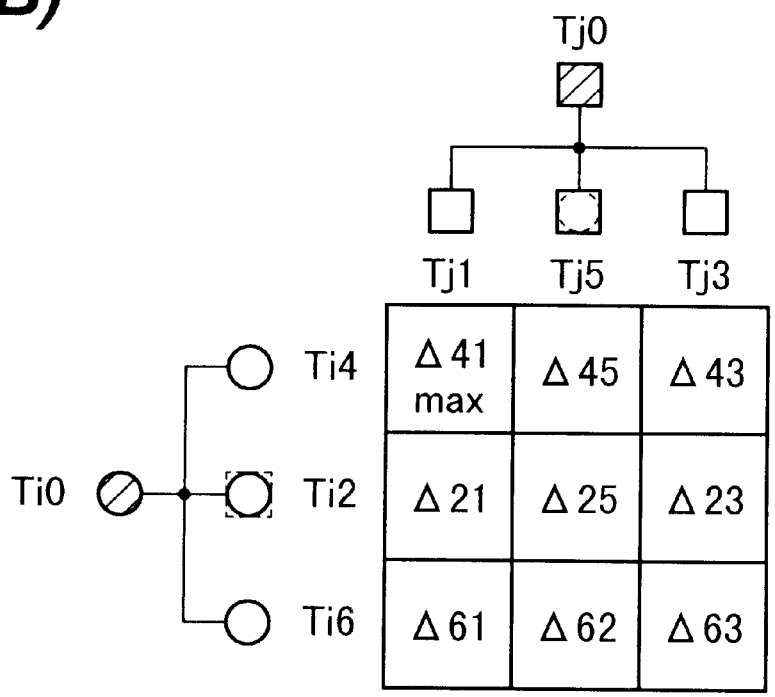

(S23) Equivalent input terminals with Δmax are exchanged. In FIG. 7(A), the input terminals Ti5 and Tj2 will be exchanged with each other, and after this exchange, new combinations of the input terminals are got as shown in FIG. 7(B). With this exchange, decrements Δ in wiring length will be changed on input terminal combinations in the column and the row both including the Δmax of before-exchange. Δ25=−Δ52 and Δ25<0.

(S24) Decrements Δ of after-exchange are calculated in regard to the row and column including the Δmax of before-exchange. Then the process returns to step S20.

The processing from steps S20 to S24 are repeated, and when all the decrements Δ become negative or 0, a negative judgment is made in step S22 and processing of step S08 in FIG. 3 is terminated.

Figure 9:
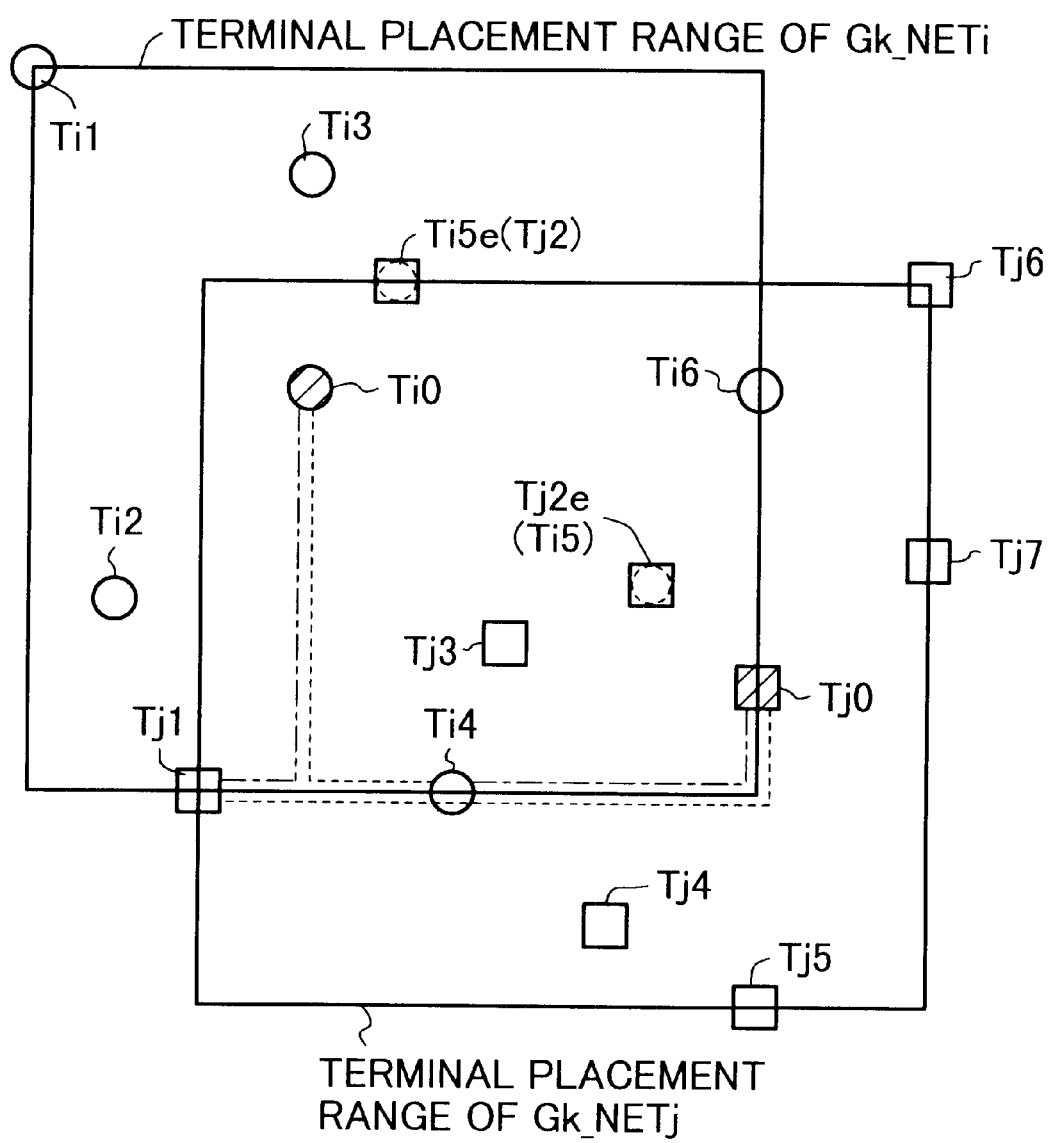
FIG. 9 is a diagram showing interconnections before and after the exchange of an input terminal Ti4 with an input terminal Tj1, taking place for a second time, respectively in dotted lines and dot-dash lines.

FIG. 9 shows interconnections before and after the exchange of an input terminal Ti4 with an input terminal Tj1, taking place for the second time, respectively in dotted lines and dot-dash lines. In FIG. 9, reference characters Ti5e and Tj2e are new terminal names after the first exchange, and respectively correspond to the input terminals Tj2 and Ti5 of before-exchange.

Figure 10:
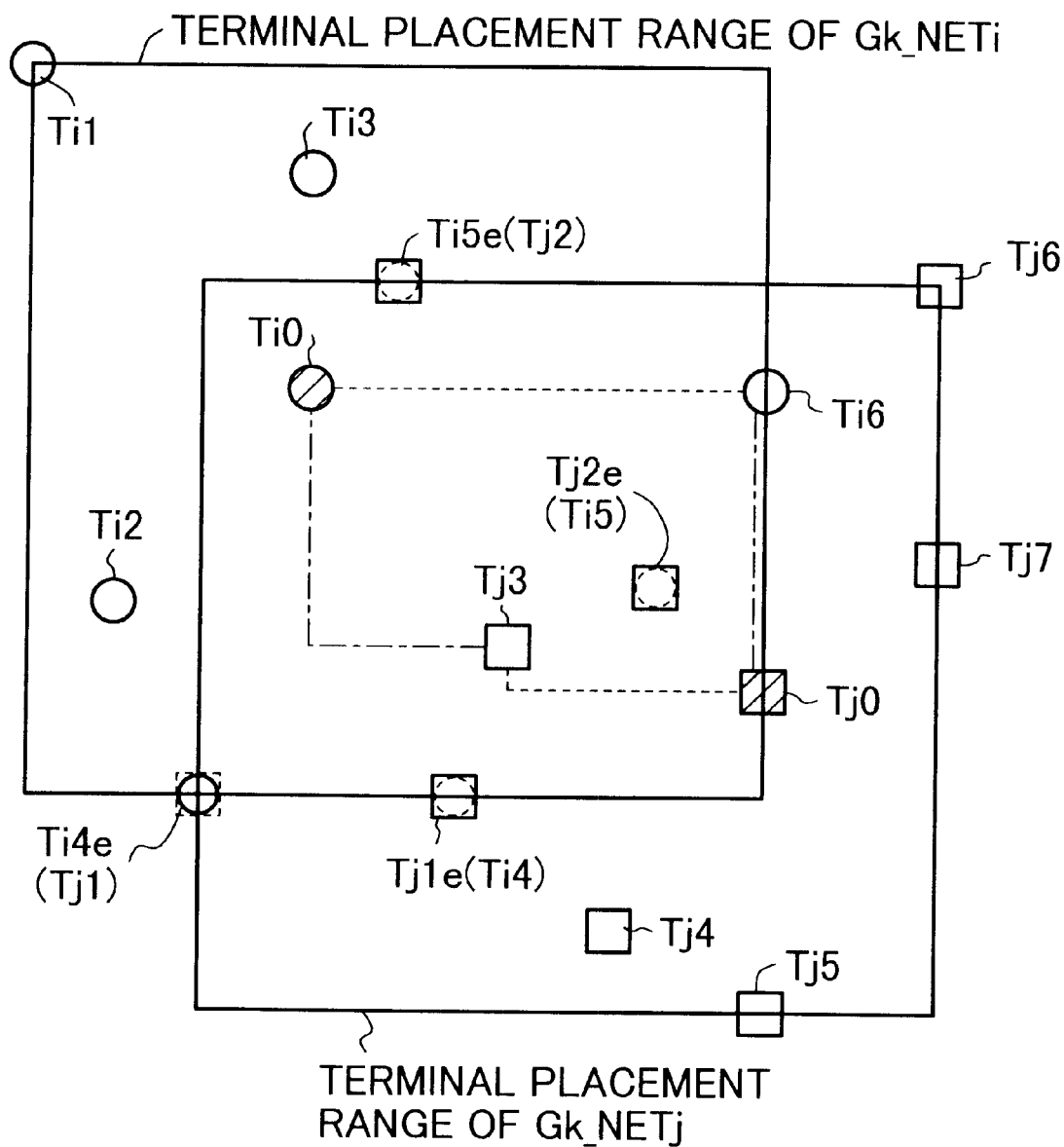
FIG. 10 is a diagram showing interconnections before and after the exchange of an input terminal Ti6 with an input terminal Tj3, taking place for a third time, respectively in dotted lines and dot-dash lines.

FIG. 10 shows interconnections before and after the exchange of an input terminal Ti6 with an input terminal Tj3, taking place for the third time, respectively in dotted lines and dot-dash lines. In FIG. 10, reference characters Ti4e and Tj1e are new terminal names after the second exchange, and respectively correspond to the input terminal names Tj1 and Ti4 of before-exchange.

Figure 11:
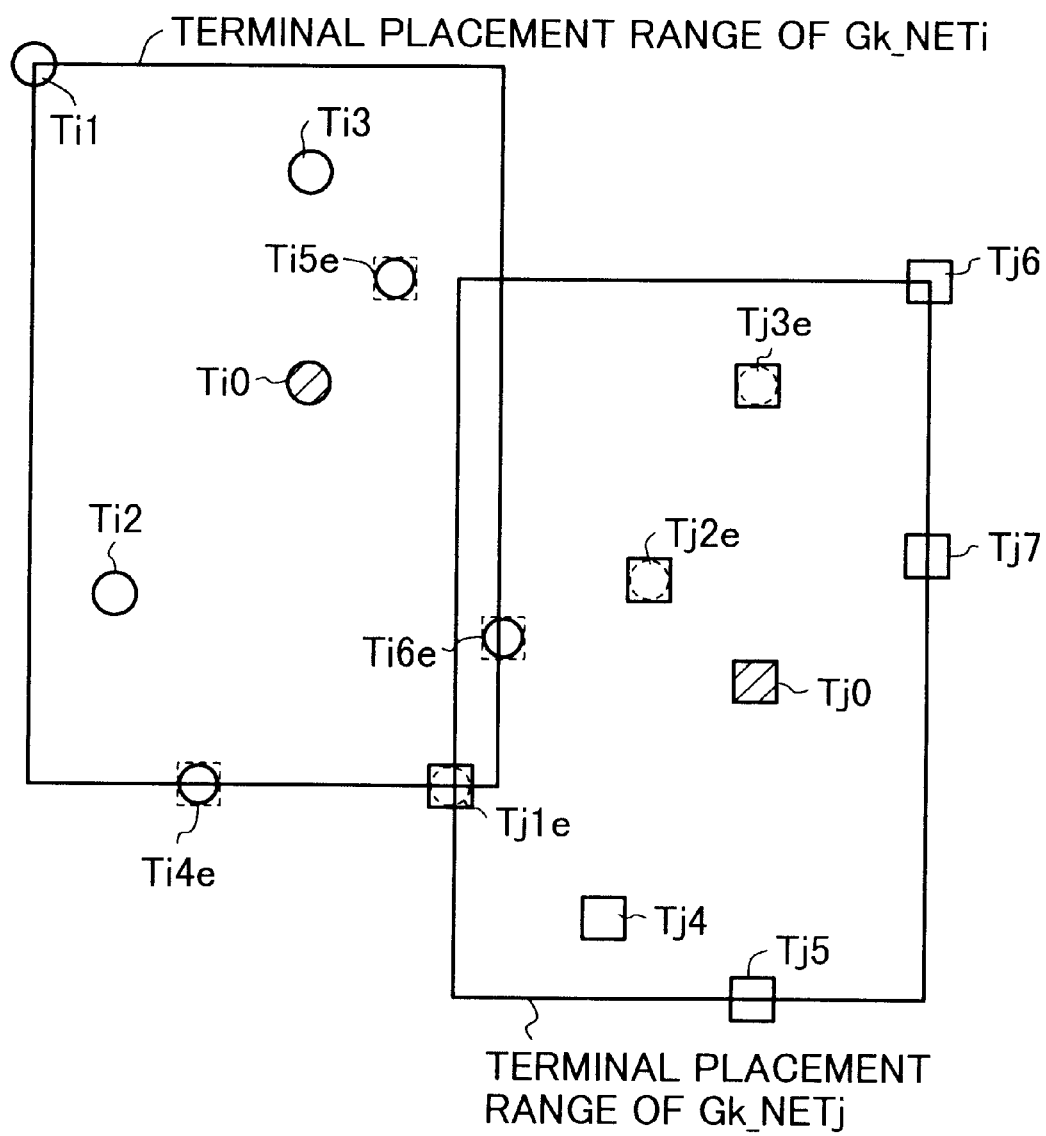
FIG. 11 is a diagram showing terminal placements and ranges thereof after auto-placement improving process.
Figure 12:
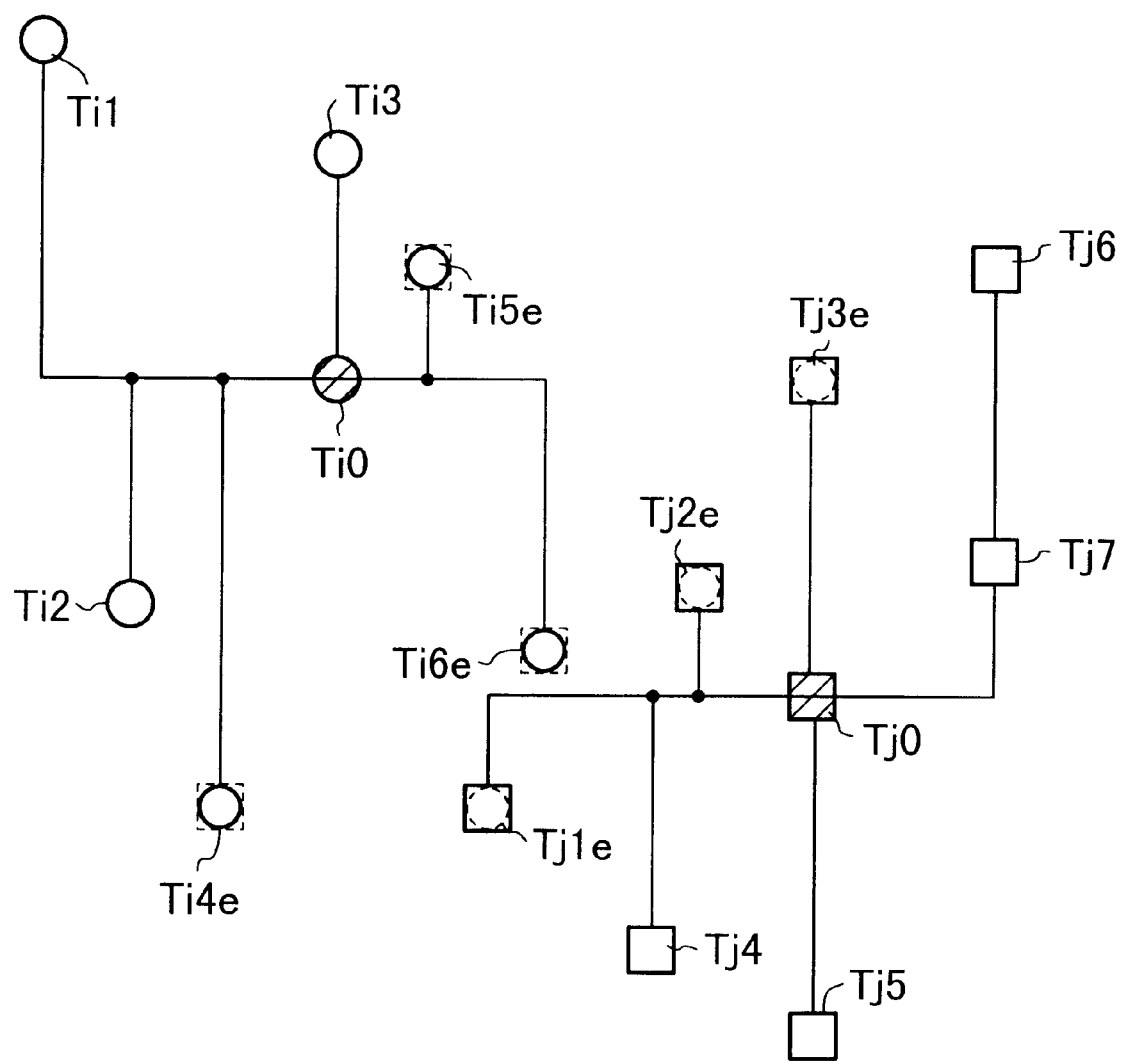
FIG. 12 is a diagram showing wiring in Steiner tree construction applied to the terminal placements of FIG. 11.

After the terminal exchange of FIG. 10, the ranges of terminal placement of Gk_NETi and Gk_NETj become as shown in FIG. 11, and an overlap region between the terminal placement ranges of Gk_NETi and Gk_NETj are narrower than in the case of FIG. 5. FIG. 12 shows wiring in Steiner tree construction connecting terminals of Gk_NETi and Gk_NETj of FIG. 11 therebetween. It is apparent that there is no crossing between Gk_NETi and Gk_NETj and a degree of wiring congestion is lower than that before the improvement processing of FIG. 6.

Second Embodiment

Figure 13:
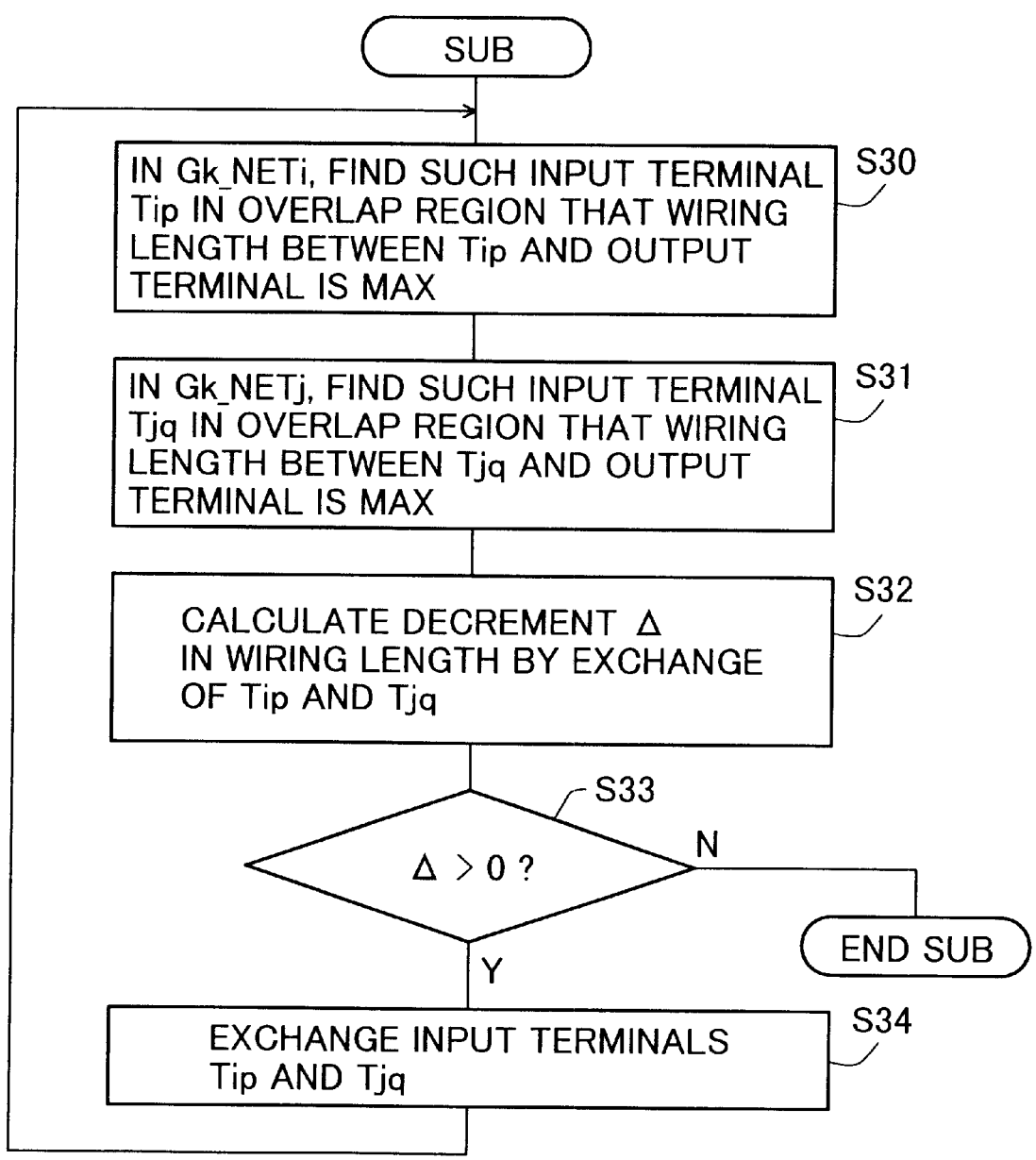
FIG. 13 is another detailed flow chart of step S08 in FIG. 3 as a second embodiment of the present invention.

FIG. 13 shows another detailed flow chart of step S08 in FIG. 3 as the second embodiment of the present invention.

(S30) In regard to Gk_NETi, such an input terminal Tip in the overlap region between the terminal placement ranges of Gk_NETi and Gk_NETj is found out that a wiring length between Tip and the output terminal of Gk_NETi is maximum.

(S31) In regard to Gk_NETj, such an input terminal Tjq in the overlap region between the terminal placement ranges of Gk_NETj and Gk_NETi is found out that a wiring length between Tjq and the output terminal of Gk_NETj is maximum.

(S32) A decrement Δ in wiring length by the exchange of Tip and Tjq therebetween is calculated.

(S33) If Δ>0, then the process goes to step S34, or else the processing of step S08 in FIG. 3 is terminated.

(S34) The input terminals Tip and Tjq are exchanged therebetween, and the process returns to step S30.

With the above processing of FIG. 13, in the case of FIG. 5, as in the first embodiment, the input terminal exchanges of FIGS. 8, 9 and 10 are sequentially performed and results shown in FIGS. 11 and 12 are obtained. In this second embodiment, since objects Tip and Tjq to be exchanged in which a decrement Δ is maximum is predicted, a work load of calculation is reduced compared with the case of the first embodiment and a processing time can be decreased.

Third Embodiment

When three or more of terminal placement ranges of nets in the same group are overlapped, results of the exchanges will be different according to the order of selection of a pair net for terminal exchange. Since an effect of terminal exchange is considered to be higher as an overlap region of terminal placement ranges including the net pair is larger in area, the processing is preferably performed in decreasing order of overlap area.

Figure 15A:
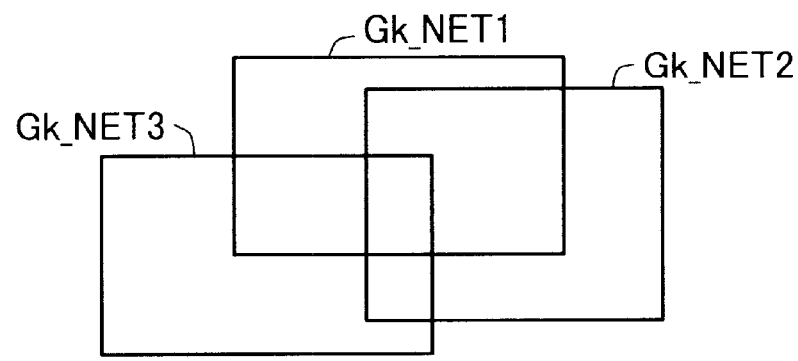
FIGS. 15(A) to 15(D) are illustrations of the process of FIG. 14.
Figure 15B:
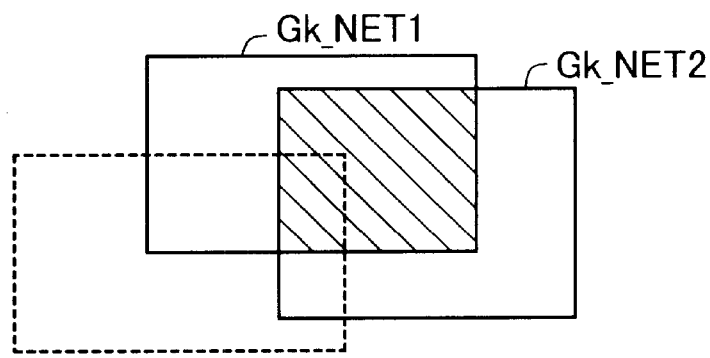
Figure 15C:
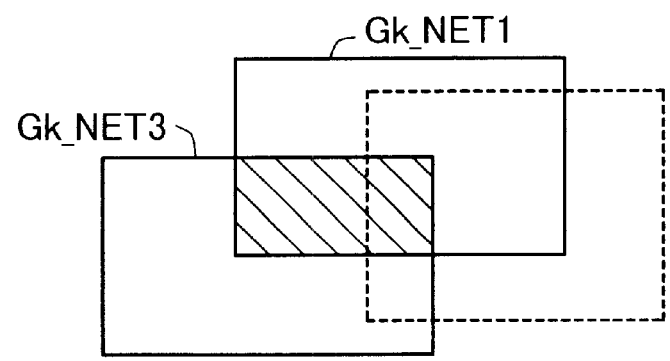
Figure 15D:
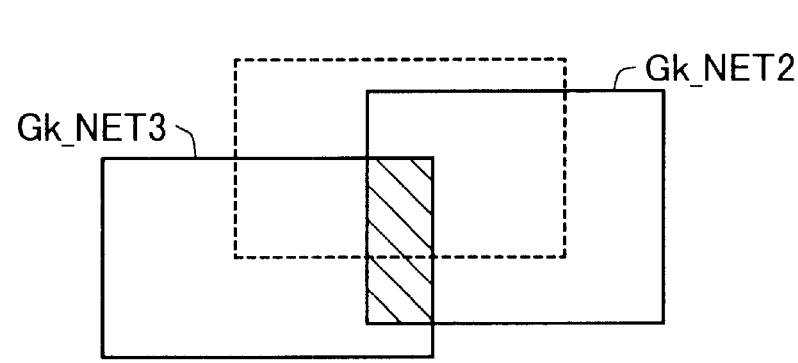

For example, as shown in FIG. 15(A), when Gk_NET1 to Gk_NET3 are overlapped one another, the terminal exchange processing of FIGS. 4 or 13 are performed in decreasing order of overlap area: firstly a combination of Gk_NET1 and Gk_NET2 (FIG. 15(B)), secondly a combination of Gk_NET1 and Gk_NET3 (FIG. 15(C)) and thirdly a combination of Gk_NET2 and Gk_NET3 (FIG. 15(D)).

Figure 14:
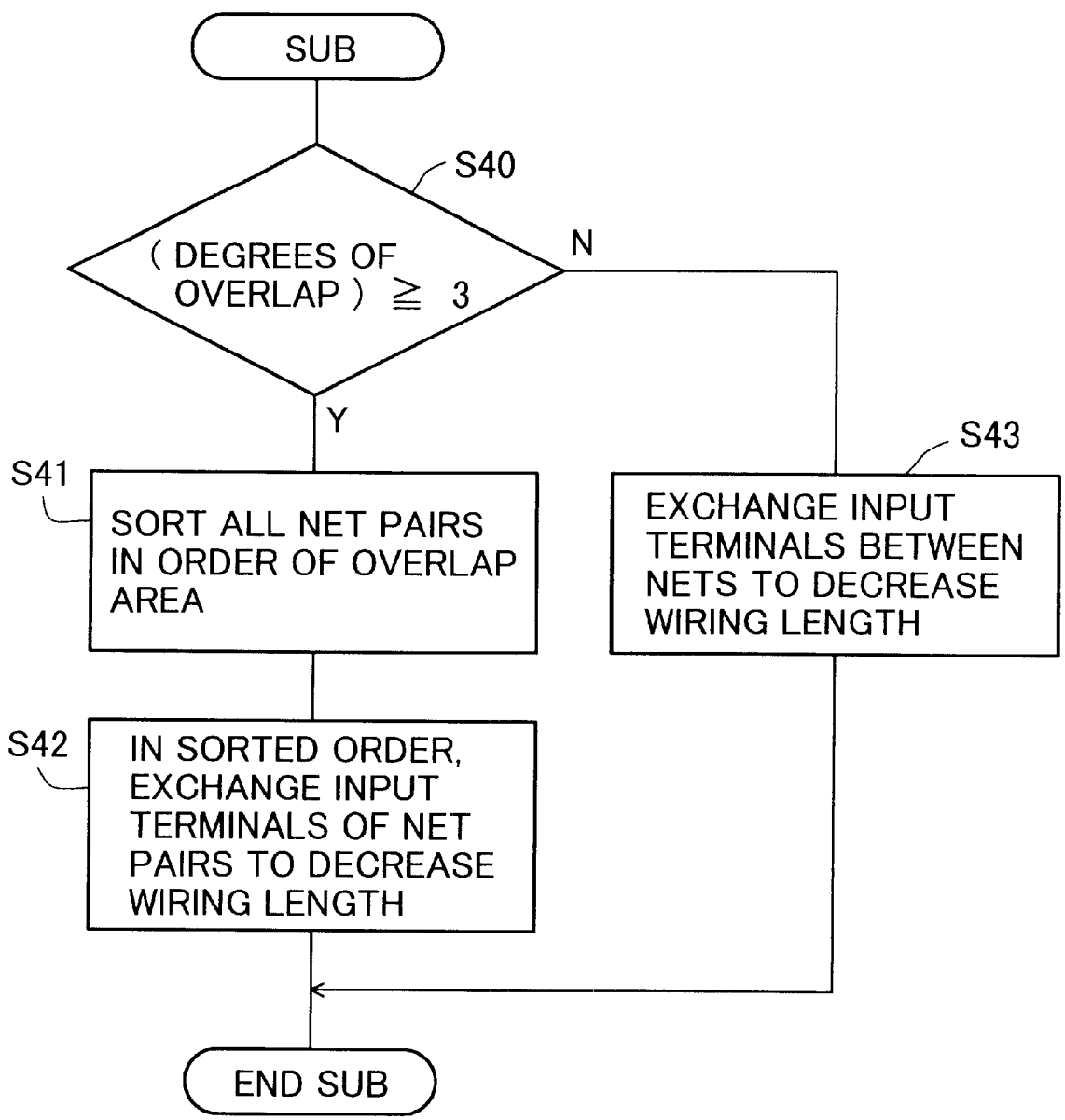
FIG. 14 is a general flow chart of a third embodiment of the present invention, showing auto-placement improving process in a case where there are three or more terminal placement ranges overlapping one another in the same group.

FIG. 14 shows a flow chart of such processing, as a third embodiment of the present invention.

(S40) When three or more of terminal placement ranges of nets in the same group are overlapped one another, the process goes to step S41 and when two terminal placement ranges of the nets are overlapped each other, the process goes to step S43.

(S41) In regard to all the terminal placement ranges of nets that have a common overlapped area, all the net pairs is sorted in a decreasing order of overlap area.

(S42) According to the decreasing order of overlap area, the processing of FIG. 4 or 13 is applied to each of the net pairs, whereby wiring lengths of each net will be decreased and the processing is terminated when all the pairs have been processed.

(S43) The processing of FIG. 4 or 13 is performed.

Fourth Embodiment

In any of the first to third embodiments, after an overlap region of terminal placement ranges of nets in the same group is determined, terminal exchanges are performed without changing in the overlap region. However, an overlap region is generally changed by terminal exchange. Therefore, each time when the terminal exchange is performed, it is possible to update an overlap region and perform processing as described above.

Figure 16:
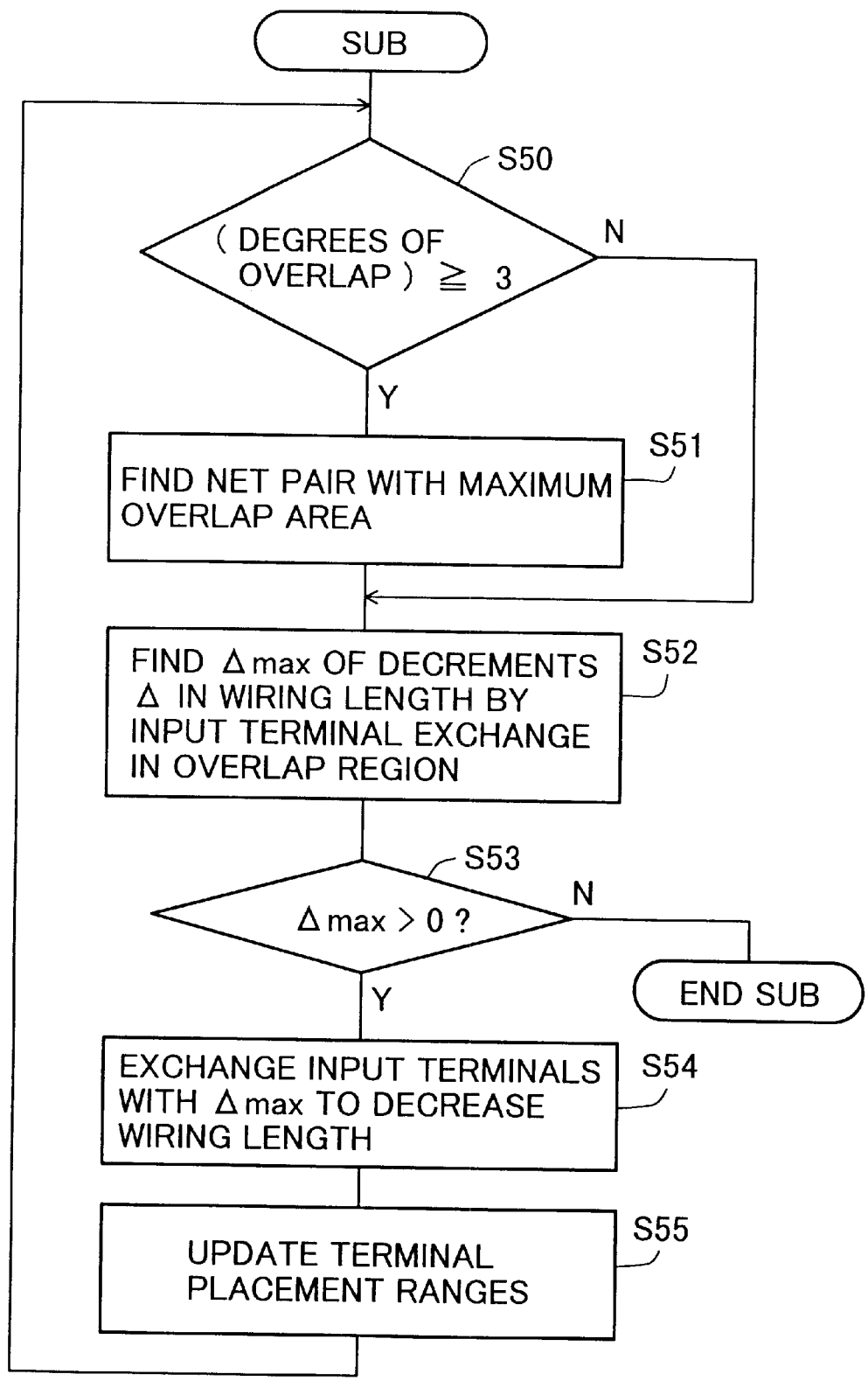
FIG. 16 is a flow chart of a fourth embodiment of the present invention, corresponding to FIG. 14.

FIG. 16 shows a flow chart of the fourth embodiment of the present invention, corresponding to FIG. 14.

(S50) If three or more of terminal placement ranges of nets in the same group are overlapped one another, then the process goes to step S51, and if two terminal placement ranges are overlapped each other, then the process goes to step S52.

(S51) A net pair with the maximum overlap area is found out.

(S52) The maximum value Δmax of decrements Δ in wiring length by input terminal exchange in an overlap region is found out in regard to the net pair found in step S51 or the net pair which is judged in step S50 to be overlapped.

(S53) If Δmax>0, then the process goes to step S54, or else the processing is terminated.

(S54) The two input terminals having Δmax are exchanged, and a wiring length will be shortened.

(S55) In regard to the net pair in which input terminals are exchanged, terminal placement ranges of the nets are updated. Then, the process returns to step S50.

Although preferred embodiments of the present invention has been described, it is to be understood that the invention is not limited thereto and that various changes and modifications may be made without departing from the spirit and scope of the invention.

For example, in FIG. 16, in stead of the processing of steps S52 to S55, the processing of steps S30 to S34 in FIG. may be performed.

Positions of terminals may be determined in consideration of a cell size or may not (cell placement position is same as terminal position) in order to satisfy a requirement of a high processing speed.

Further, between steps S01 and S02 in FIG. 3, other auto-placement improving process of a prior art may be inserted.

What is claimed is:

1. A method of improving an auto-placement by a computer, said auto-placement being performed by placing circuit elements on a design plan based on a net list, comprising the steps of:
   (1) classifying nets into groups after said auto-placement, nets of each group having logically equivalent signal to each other; and
   (2) exchanging input terminals between different nets in a group so as to shorten a wiring length;
   wherein said step (2) comprises the steps of:
      (2-1) determining terminal placement ranges of respective nets;
      (2-2) finding out an overlap region of two of said terminal placement ranges in one of said groups; and
      (2-3) exchanging said input terminals in said overlap region.

2. A method of improving auto-placement according to claim 1, wherein in said step (2-3), said exchange is performed between input terminals so that a decrement in wiring length by said exchange is maximum.

3. A method of improving auto-placement according to claim 2, wherein said step (2-3) comprises:
   in each of two nets sharing said overlap region, finding out such an input terminal in said overlap region that a wiring length between this input terminal and an output terminal is maximum; and
   exchanging said input terminals found out in the respective two nets therebetween.

4. A method of improving auto-placement according to claim 3, wherein if said overlap region that is found out in said step (2-2) is shared by three or more terminal placement ranges, in said step (2-3),
   a decreasing order of overlap areas between respective pairs of terminal placement ranges including said overlap region shared by said three or more terminal placement ranges are obtained; and
   said exchange is performed for net pairs in order corresponding to said decreasing order of said overlap areas.

5. A method of improving auto-placement according to claim 3, wherein in one overlap region found out in said step (2-2), said step (2-3) is repeatedly performed.

6. A method of improving auto-placement according to claim 5, wherein after every said step (2-3) is performed, said overlap region of said step (2-2) is updated.

7. A method of improving auto-placement according to claim 1, wherein said terminal placement range of said step (2-1) is a minimum rectangular region including all terminals in one net.

8. A method of improving auto-placement according to claim 1, wherein said wiring length in said step (2) is a Manhattan length.

9. A storage medium having a computer program of auto-placement improving process, said auto-placement being performed by placing circuit elements on a design plan based on a net list, said process comprising the steps of:
   (1) classifying nets into groups after said auto-placement, nets of each group having logically equivalent signal to each other; and
   (2) exchanging input terminals between different nets in a group so as to shorten a wiring length;
   wherein said step (2) comprises the steps of:
      (2-1) determining terminal placement ranges of respective nets;
      (2-2) finding out an overlap region of two of said terminal placement ranges in one of said groups; and
      (2-3) exchanging said input terminals in said overlap region.

10. An apparatus for improving auto-placement comprising a computer on which a program of auto-placement improving process is installed, said auto-placement being performed by placing circuit elements on a design plan based on a net list, said process comprising the steps of:
    (1) classifying nets into groups after said auto-placement, nets of each group having logically equivalent signal to each other; and
    (2) exchanging input terminals between different nets in a group so as to shorten a wiring length;
    wherein said step (2) comprises the steps of
       (2-1) determining terminal placement ranges of respective nets;
       (2-2) finding out an overlap region of two of said terminal placement ranges in one of said groups; and
       (2-3) exchanging said input terminals in said overlap region.

11. A fabrication method of a semiconductor device according to a design thereof, wherein in a design stage, auto-placement improving process is performed by a computer, said auto-placement being performed by placing circuit elements on a design plan based on a net list, said process comprises the steps of:
    (1) classifying nets into groups after said auto-placement, nets of each group having logically equivalent signal to each other; and
    (2) exchanging input terminals between different nets in a group so as to shorten a wiring length;
    wherein said step (2) comprises the steps of
       (2-1) determining terminal placement ranges of respective nets;
       (2-2) finding out an overlap region of two of said terminal placement ranges in one of said groups; and
       (2-3) exchanging said input terminals in said overlap region.

* * * * *

UNITED STATES PATENT AND TRADEMARK OFFICE
CERTIFICATE OF CORRECTION

PATENT NO.    : 6,442,744 B1
DATED         : August 27, 2002
INVENTOR(S)   : Hideaki Ishii It is certified that error appears in the above-identified patent and that said Letters Patent is hereby corrected as shown below:

<u>Title page,</u>
Please change the Assignee information to the following:
-- [73]  Assignee: Fujitsu Limited, Kawasaki  (JP) --

Signed and Sealed this

Twenty-fourth Day of December, 2002

JAMES E. ROGAN
*Director of the United States Patent and Trademark Office*